United States Patent [19]
Goto et al.

[11] Patent Number: 4,851,776
[45] Date of Patent: Jul. 25, 1989

[54] WEAK FIELD MEASURING MAGNETOMETER WITH FLUX MODULATED CURRENT CONDUCTING JOSEPHSON JUNCTION

[75] Inventors: Eiichi Goto, Fujisawa; Yutaka Harada, Tokyo, both of Japan

[73] Assignee: Research Development Corporation, Tokyo, Japan

[21] Appl. No.: 133,984

[22] Filed: Dec. 16, 1987

[30] Foreign Application Priority Data

Dec. 18, 1986 [JP] Japan .................. 61-301944

[51] Int. Cl.$^4$ ........................................... G01R 33/035
[52] U.S. Cl. ..................................................... 324/248
[58] Field of Search ...................... 324/248, 345, 346; 307/306, 309; 128/653; 357/5

[56] References Cited

U.S. PATENT DOCUMENTS

| | | | |
|---|---|---|---|
| 4,315,215 | 2/1982 | Onodera et al. | 324/248 |
| 4,389,612 | 6/1983 | Simmonds et al. | 324/248 |
| 4,663,590 | 5/1987 | Gershenson et al. | 324/248 |

FOREIGN PATENT DOCUMENTS

| | | | |
|---|---|---|---|
| 2528186 | 4/1978 | Fed. Rep. of Germany | 324/248 |
| 0148077 | 11/1981 | Japan | 324/248 |
| 0174866 | 10/1983 | Japan | 324/248 |
| 0196480 | 11/1984 | Japan | 324/248 |

OTHER PUBLICATIONS

Foglietti et al., Low-Frequency Noise in Low 1/f Noise dc Squid's Appl. Phys. Lett., vol. 49, No. 20, Nov. 17, 1986, pp. 1393-1395.

Primary Examiner—Gerard R. Strecker
Attorney, Agent, or Firm—Fleit, Jacobson, Cohn, Price, Holman & Stern

[57] ABSTRACT

A sensitive magnetometer for determining the strength of a very weak magnetic field having at least one Josephson junction through which current induced by the magnetic field and modulated in accordance with a modulation magnetic flux which varies periodically, is conducted. Harmonic separating means separately detects a selected even harmonic component from the current flowing in the Josephson junction to obviate the need for null flux calibration.

7 Claims, 4 Drawing Sheets

WEAK FIELD MEASURING MAGNETOMETER WITH FLUX MODULATED CURRENT CONDUCTING JOSEPHSON JUNCTION

BACKGROUND OF THE INVENTION

1. Field of the Invention

The present invention relates to an apparatus for detecting a very weak magnetic field emanating from a human body, particularly from a person's heart or brain, or originating from ionosphere high above the surface of the earth or from an oil field deep under the ground, and any other weak magnetic field.

2. Description of the Prior Art

A dc superconducting quantum interference device (abbrebiated as "dc-SQUID") or a radiofrequency superconducting quantum interference device (abbrebiated as "rf-SQUID") using Josephson junctions has been hitherto used in measuring a very weak magnetic field with increased sensitivity. Its output signal representing the magnetic flux of such a weak magnetic field, contains a non-zero constant, which is called "dc offset". Where the magnitude of the magnetic flux rather than the amount of vaiation of magnetic flux is to be determined, it is necessary to carry out null flux calibration by subtracting the dc offset value from the output signal appearing at the output terminals of the SQUID device. The null flux calibration, however, is very difficult to perform.

SUMMARY OF THE INVENTION

One object of the present invention is to provide a very high-sensitive magnetometer which is capable of determining the strength of a very weak magnetic field without null flux calibration.

To attain this object an extremely sensitive magnetometer according to the present invention comprises at least one Josephson junction, means magnetically coupled to a weak magnetic field having an input magnetic flux to be determined and means for generating a modulation magnetic flux of a given frequency, to produce an electric current conducted to the Josephson junction, and means for separating from such current flowing in the Josephson junction a particular even harmonic current component, which is a direct proportional function of the strength of the input magnetic flux.

Assume that an input magnetic flux $\Phi_x$ and a modulation magnetic flux $\Phi_f$ of an angular frequency $\omega$ are applied to the Josephson junction. The resultant magnetic flux $\Phi$ is given by:

$$\Phi = \Phi_x + Z \cos \omega t$$

The electric current I flowing in the Josephson junction is given by:

$$I = I_M \sin \phi \quad (1),$$

where $\phi(=2\pi\Phi/\Phi_\theta)$ stands for flux phase angle, $\Phi_\theta(=2\times 10^{-7}$ gauss cm$^2$) stands for flux quantum and $I_M$ stands for critical current.

The equation of the resultant magnetic flux can be rewritten as follws:

$$\phi = \phi_x + z \cos \omega t,$$

where $\phi_x = 2\pi\Phi_x/\Phi_\theta$ and $z = 2\pi Z/\Phi_\theta$ ("z" called "index of modulation").

This rewritten equation is put in Equation (1), and then the electric current I is given in the form of Fourier series as follows:

$$I = I_M \sin(\phi_x + z \cos\omega t) \quad (2)$$

$$= I_M (\sin\phi_x \cdot \cos(z \cos\omega t) + \cos\phi_x \cdot \sin(z \cos\omega t))$$

$$= I_M \sin\phi_x \cdot \left( J_0(z) + 2 \sum_{n=1}^{\infty} (-1)^n J_{2n}(z)\cos 2n\omega t \right)$$

$$+ 2 I_M \cos\phi_x \cdot \left( \sum_{n=0}^{\infty} J_{2n+1}(z)\cos((2n+1)\omega t) \right)$$

where $J_{k(z)}$ is a Bessel function of the "k" order.

Assume that the magnetic flux angle of an input magnetic field $\phi_x$ is small, compared with $\Phi_\theta$, that is $\phi_x << \Phi_\theta$. Sin $\phi_x$ will then be almost equal to $\phi_x$, and cos $\phi_x$ almost equal to one. Then, an even harmonic component $I_{2\,nf}$ is given by:

$$I_{2nf} = I_M \phi_x (-1)^n J_{2n(z)} \cos(2n\omega t) \quad (3)$$

As is apparent from Equation 3, an even harmonic component $I_{2\,nf}$ is proportional to $\phi_x$, and its sign represents the direction of the input magnetic flux $\Phi_x$ (the reverse of the sign of the input magnetic flux $\Phi_x$ represented by the reverse of the phase of the even harmonic component). Here, it should be noted that the flux phase angle $\phi_x$ is eqal to zero for no input magnetic flux $\Phi_x$ and that every even harmonic components disappears for no input magnetic flux.

Assume that a given even harmonic component, for instance, a harmonic component of the second order $I_{2f}$ is separated, and that it is subjected to synchronous phase detection in terms of the modulation flux signal. Then, the detection signal $S_{out}$ is proportional to the input magnetic flux $\Phi_x$.

$$S_{out} = G\Phi_x \quad (4),$$

where "G" stands for the gain of the detection system. In a conventional magnetometer using dc-SQUIDs or ac-SQUIDs the corresponding equation is given by:

$$S_{out} = S_0 + G\Phi_x \quad (5),$$

where "$S_0$" is a dc offset value. As already described, the null flux calibration is very difficult to perform; the exact determination of dc offset value is almost impossible. In the present invention, advantageously there is no necessity for null flux calibration because $S_0$ is zero.

EMBODIMENTS

Figure 1:
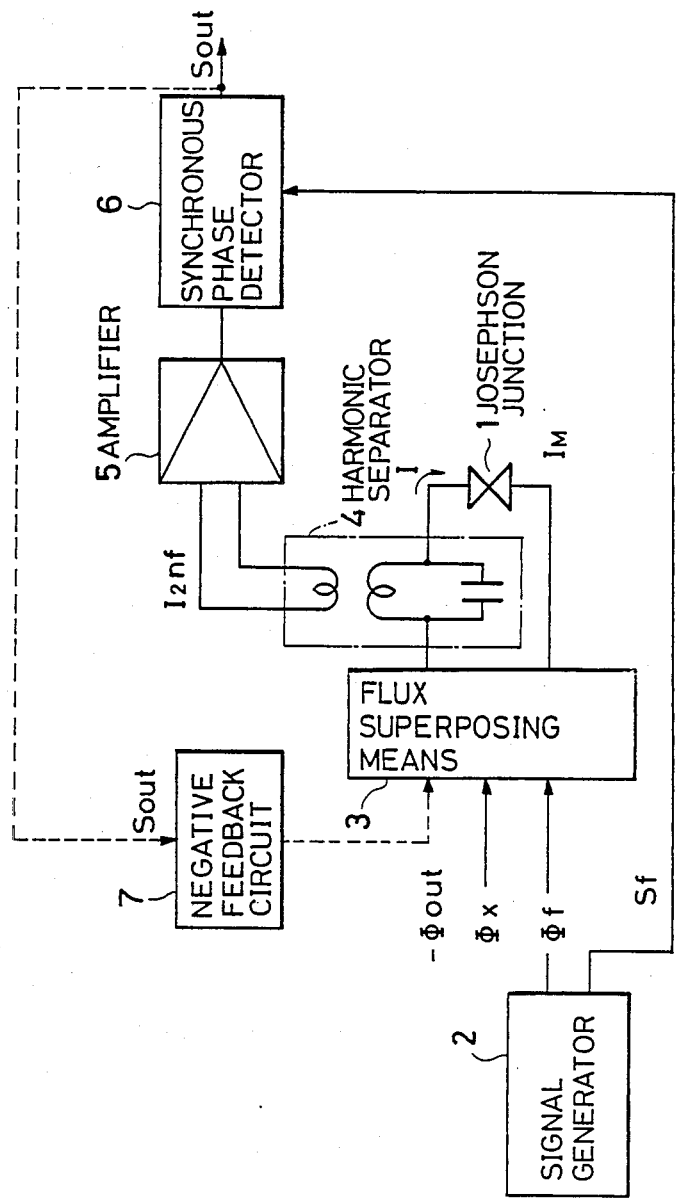
FIG. 1 shows a schmatic wiring diagram of an extremely sensitive magnetometer according to a first embodiment of the present invention.
Figure 2:
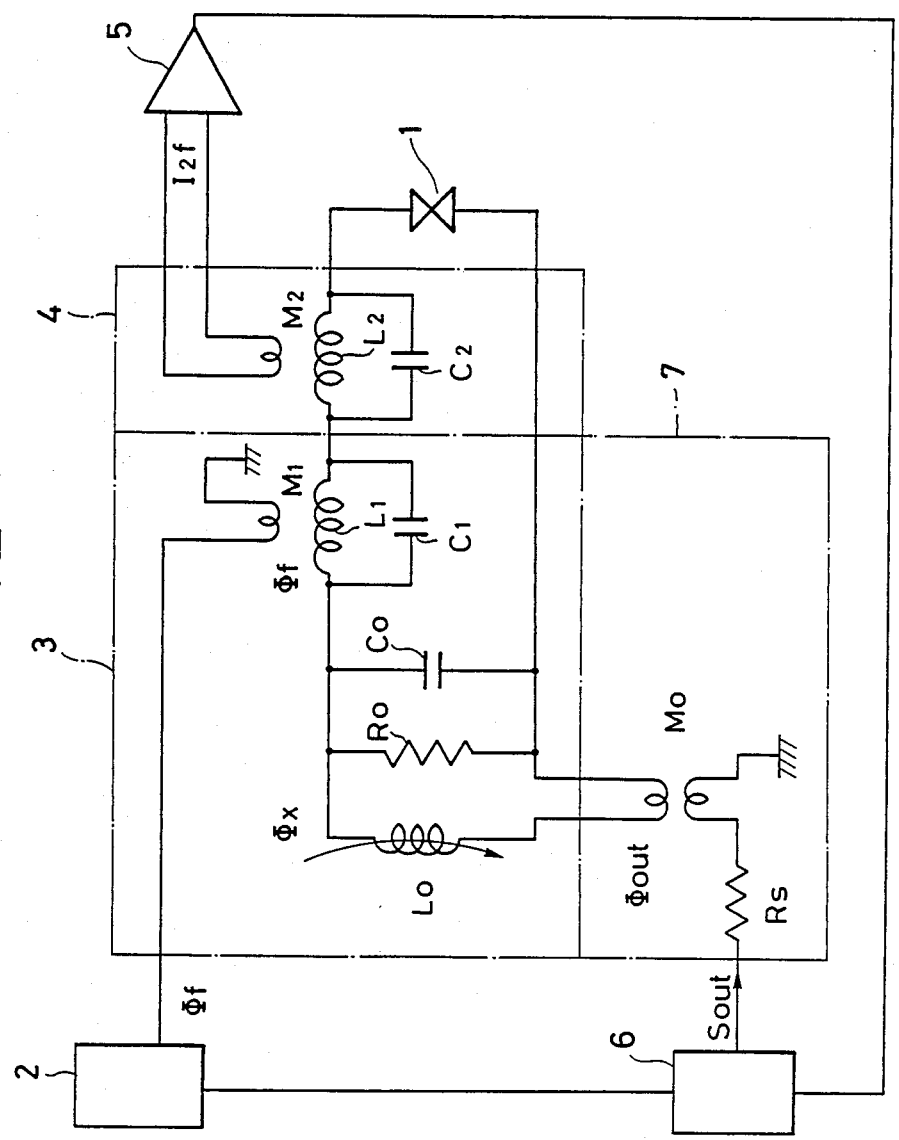
FIG. 2 shows a schematic wiring diagram of the flux superposing means, harmonic separator means and feedback circuit of the magnetometer of FIG. 1.

FIGS. 1 and 2 show an extremely sensitive flux meter according to a first embodiment of the present invention. In FIG. 1 a Josephson junction whose critical current is $I_M$, is indicated at 1. Signal generating means for producing modulation magnetic flux $\Phi_f$ of angular frequency $\omega$ and a synchronous signal $S_f$ is indicated at 2. Means for producing an electric current representing an input magnetic flux $\Phi_x$ to be determined and the modulation magnetic flux $\Phi_f$ conducted to the Josephson junction 1 in a superposing fashion, is indicated at 3. Means for separating a particular even harmonic component $I_{2nf}$ from the electric current I flowing in the Josephson junction 1, is indicated at 4. An amplifier is indicated at 5. A synchronous phase detector is indicated at 6. Finally a negative feedback circuit is indicated at 7.

In this particular embodiment the output signal $S_{out}$ is fedback to superpose on the input magnetic flux $\Phi_x$, thereby making the effective gain of the very high-sensitive magnetometer stable and, at the same time, expanding the dynamic measurement range of the input magnetic flux $\Phi_x$.

The signal generator 2, the amplifier 5 and the synchronous phase detector 6 are well known, and therefore no detailed description is necessary. The flux superposing means 3 and the harmonic separator 4 are described below with reference to FIG. 2.

In FIG. 2 a pickup coil $L_0$ inductively coupled to a weak magnetic field is used to induce an electric current in response to an input magnetic flux $\Phi_x$ of such magnetic field to be determined. The coil $L_0$ and a capacitor $C_0$ together make up a low-pass filter for the input magnetic flux. A resistor $R_0$ is a damping resistor. A coil $L_1$ and a capacitor $C_1$ together make up a first filter for the modulation flux $\Phi_f$ of frequency f.

The output current from these two filters of the flux superposing means 3 is conducted to the Josephson junction 1 in a superposing or adding fashion through the harmonic separator 4.

A coil $L_2$ and a capacitor $C_2$ together make up a second filter within the harmonic separator having resonance frequency $2_{nf}$ to separate a 2n-order harmonic component $I_{2nf}$ from the electric current I flowing in the Josephson junction 1 and supply the selected harmonic component to the amplifier 5 via an inductive coupling as shown having a mutual inductance $M_2$. A resistor $R_s$ and an inductive coupling having a mutual inductance $M_0$ together make up a negative feedback circuit 7 as shown to apply the output signal $S_{out}$ from detector 6 to the input of the system. In the embodiment as shown in FIG. 2 the operative coupling of magnetic fluxes to the Josephson junction 1 in a superposing fashion is carried out by the low-pass filter of flux superposing means 3 (cut-off frequency $f_0$) and the first filter, and separation of desired harmonic current component by the second filter of harmonic separator 4.

In the magnetometer according to the present invention the Josephson junction is kept in its superconducting state, and is used as a nonlinear inductor, as is different from a dc-SQUID.

The dynamic inductance $L_j$ of the Josephson junction is assumed to be $\Phi_0/(2\pi I_M)$, and if the dynamic inductance $L_j$ is selected to be larger than $L_0+L_1+L_2$, no hysteresis appears in the current-to-magnetic flux characteristics of the Josephson junction. Therefore, magnetometer according to the present invention is substantially free from the shot noise due to normal conducting electrons and the 1/f noise which is proportional to the inverse of frequency on the lower frequency side. This noise is liable to appear in dc-SQUIDs and ac-SQUIDs.

A Johnson noise or thermal noise, however, is liable to appear in magnetometer according to the present invention. In FIG. 2 such noise is caused by a damping resistor $R_0$ in the low-pass filter. This resistor is necessitated to lower the sharpness of resonance "Q" around resonant frequency $f_0(=\sqrt{C_0L_0}/2\pi)$, and it is a main cause for Johnson noise.

Such a resistor and hence the Johnson noise can be eliminated by using a balanced modulator composed of two Josephson junctions in place of the low-pass filter for the purpose of conducting a current induced by a magnetic field having an input magnetic flux $\Phi_x$ (low frequency $f_0$) and a modulation magnetic flux $\Phi_f$ (low frequency f) to a Josephson junction in a superposing fashion and of selectively separating an electric current harmonic (frequency 2 nf) from the electric current flowing in the Josephson junction. A circuit for superimposing different magnetic fluxes and separating a desired electric current harmonic without the accompanying Josephson noise is described below with reference to FIG. 3. The circuit is shown as having no negative feedback simply for the sake of convenience in illustration.

Figure 3:
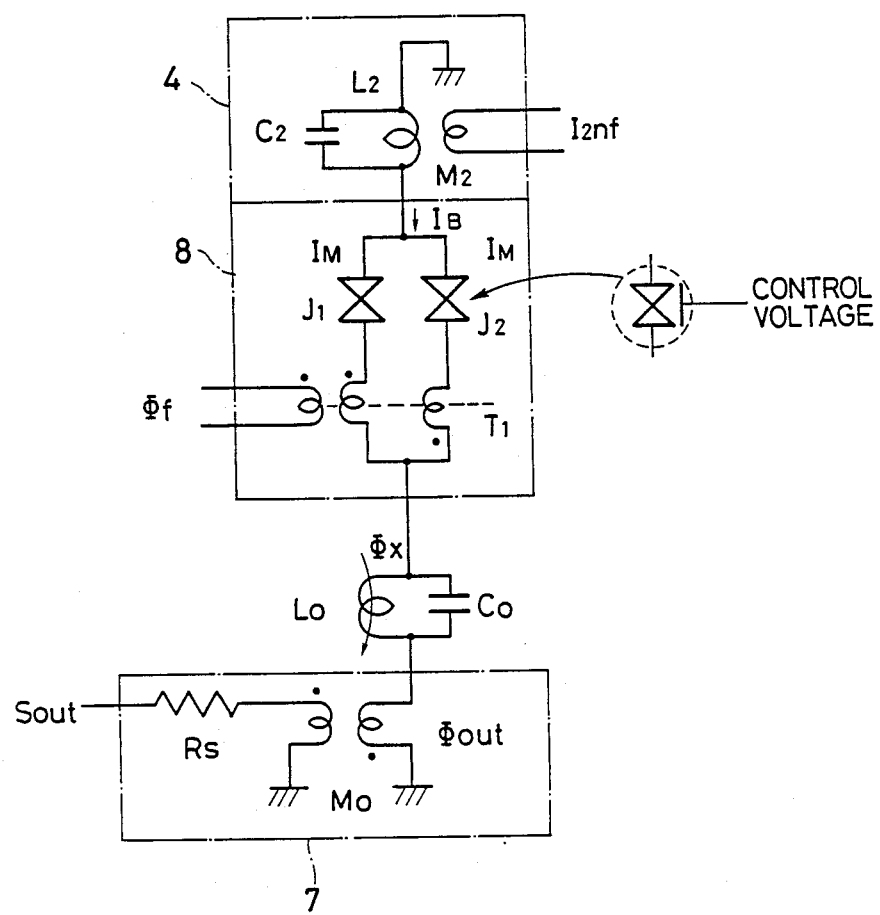
FIG. 3 shows a schematic wiring diagram of an extremely sensitive magnetometer according to a second embodiment of the present invention using a balanced modulator as flux superposing means.

In FIG. 3 a balanced modulator 8 corresponds to the first filter $L_1$, $C_1$, and the Josephson junction 1 in FIG. 2, and the other components 4 and 7 of FIG. 3 respectively correspond to those numbered 4 and 7 in FIG. 2. The two Josephson junctions $J_1$ and $J_2$ have a same critical current $I_M$. The electric current $I_B$ flows through these two Josephson junctions. This electric current $I_B$ is called "balanced modulation current". The balanced modulator 8 uses a transformer having three superconducting windings $T_1$ (two mutual inductances). The summation of input and modulation magnetic fluxes ($\Phi_x+\Phi_f$) represented by a modulation output current is conducted to the Josephson junction $J_1$, whereas the difference current obtained by subtraction of the modulation magnetic flux from the input magnetic flux ($\Phi_x-\Phi_f$) is conducted through the Josephson junction $J_2$. The electric current $I_B$ (balanced modulation current) is a summation of the currents flowing through these two Josephson junctions. The electric current $I_B$ is given by summarizing the electric current of Equation 2 in terms of the indexes z and $-z$ as follows:

$$I_B = 2I_M \sin \phi_x (J_0(z) + 2\Sigma(-1)^n J_{2n}(z) \cos (2nwt) \quad (6)$$

As seen from Equation 6, no double odd harmonics appear in the Fourier series, and this is most advantageous to separation of a particular even harmonic by a harmonic separator 4.

In making a balanced modulator 8 it is necessary to use a pair of Josephson junctions having the same characteristics to cause disappearance of the modulation fundamental component in the balanced modulation current $I_B$. If the Josephson junctions used have different characteristics, the modulation fundamental component will appear in the output signal, thereby causing a malfunction in measurement. The fundamental component is large in value, compared with the other harmonics, and therefore an appreciable malfunction would be caused even if there should be a small difference in characteristics. A Josephson junction is composed of a sandwich structure having a very thin insulation layer (several ten angstroms) between two superconducting metals. Because of this minute structure it is very difficult to make Josephson junctions each having identical critical current value. In an attempt to solve this problem a voltage-driven type three-terminal superconducting device $J_2'$ may be used. This three terminal element is described, for instance, in "Three-Terminal Superconducting Device Using an Si Single Crystal Film", by Nishino et al, IEEE Electron Device Lett., vol. EDL-6No. 6 pp. 297-299, June 1985. In this voltage-driven type three-terminal superconducting device the critical current or Josephson current flowing from the source to drain of the device varies with the voltage applied to the gate terminal of the device. Therefore, the critical voltages of the Josephson junctions $J_1$ and $J_2$ can be easily set at equal value by appropriately selecting the control voltages which are to be applied externally to the gate terminals of the devices. At the time of performing an initial adjustment in the magnetometer, such control voltages may be selected so as to reduce the fundamental components of the balanced modulation current $I_B$ to zero for zero input signal. Also, any variabilities of transformers $T_1$ in their characteristics can be reduced by adjusting the control voltages to be applied to associated Josephson junctions. In place of such voltage-driven type three-terminal superconducting devices any devices whose critical current can be controlled by input signals in the form of electric current, magnetic flux and the like can be used.

Figure 4:
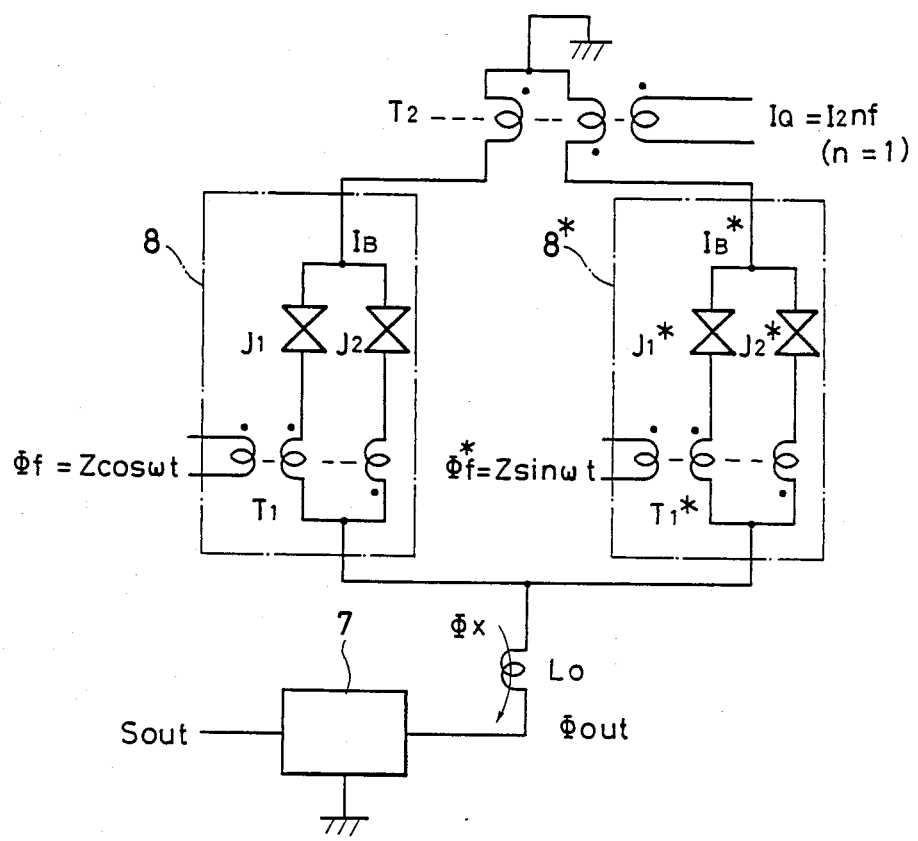
FIG. 4 shows a schmatic wiring diagram of an extremely sensitive magnetometer according to a third embodiment of the present invention using a dual balanced modulator as flux superposing means plus harmonic separator means.

A pair of balanced modulators each composed of two Josephson junctions (four Josephson junctions in total) may be used to separately eliminate dc component and double odd harmonics (2.1=2, 2.3=6, 2.5=10) without using a filter. The principle according to which dc component and double odd harmonics can be eliminated is described with reference to FIG. 4:

In FIG. 4 a pickup coil for an input magnetic flux $\Phi_x$ is indicated by $L_0$; balanced modulators are indicated at 8 and 8* and a transformer (superconducting winding) by $T_2$. The transformer $T_2$ functions as a harmonic separator, and the balanced modulators 8 and 8* function as magnetic flux superposing means.

The phase of one of the modulation fluxes of the magnetic field inductively coupled to the balanced modulators 8 and 8* is 90 degree off from that of the other modulation flux. The difference current $I_Q(=I_B-I_B^*)$ is derived from the transformer $T_2$.

Then, the differnce current $I_Q$ can be given by:

$$I_Q = 8I_M \sin \phi_x \Sigma J_{2(2n+1)}(z) \cos [2(2n+1)wt] \quad (7)$$

As is apparent from Equation (7), the double even components 0f (dc component), 4f, 8f, 12f..., which are found in Equation (6), disappear, and double odd components 2f, 6f, 10f, 14f... remain.

If a modulation index z is selected to cause the maximum value of $J_{2(z)}$, specifically if z is equal to 3.0 ($J_{2(z)b}$ being nearly equal to 0.5), the component of 6f is equal to 0.03 ($J_{6(3.0)}/J_{(3.0)}$), and therefore is equal to about 3 percent of the component of 2f (components of 10f and 14f being still smaller than this). Stated otherwise, the second harmonic component is predominant in $I_Q$. Thus, the transformer $T_2$ functions as a second harmonic component separator.

As is apparent from the above, magnetometer according to the present invention requires no null flux calibration, thus permitting exact measurement of the strength of a very weak magnetic field. Also, the magnetometer is almost free of any type of noises.

What is claimed is:

1. An apparatus for measuring an input magnetic flux of a magnetic field, comprising: a detection circuit having at least one Josephson junction; a signal generator including means for producing a modulation magnetic flux which varies periodically; flux superposing means operatively connected to the modulation magnetic flux producing means and inductively coupled to said magnetic field for producing a modulated input current conducted to the detection circuit as a function of said input magnetic flux of the magnetic field and the modulation magnetic flux which varies periodically; and harmonic separating means operatively connected to the detection circuit for separately detecting a particular even harmonic component of the modulated input current conducted thereto; said harmonic separation means producing an output representative of said input magnetic flux of the magnetic field.

2. An apparatus according to claim 1 wherein the harmonic separating means includes a synchronous phase detector for detecting the particular even harmonic component in accordance with the modulation magnetic flux.

3. An apparatus according to claim 1 or 2 wherein the flux superposing means includes a filter inductively coupled to the magnetic field from which an input current is induced and another filter through which the modulation magnetic flux modulates the input current, the harmonic separating means including means for separating the particular even harmonic component from the modulated input current conducted to the detection circuit.

4. An apparatus according to claim 1 wherein the flux superposing means includes an additional Josephson junction, a balanced modulator formed by both of said Josephson junctions, including means for conducting a first current representing the sum of the modulated input and modulation magnetic fluxes through one of the Josephson junctions, means for conducting a second current representing the difference between the input modulated and the modulation magnetic fluxes through the other of the Josephson junctions and means for providing the sum of the first and second currents conducted through the Josephson junctions as an output current from the balanced modulator.

5. An apparatus according to claim 4 including a second balanced modulator having a second pair of Josephson junctions, means for conducting the sum of the input modulated current and a modulation current representing the modulation magnetic flux shifted 90 degrees through one of the second pair of the Josephson junctions, and means for conducting the difference between the input modulated and the 90 degree-shifted modulation currents through the other of the second pair of the Josephson junctions; the harmonic separating means including means operatively coupled to both of the balanced modulators for producing a difference between the output currents from the respective balanced modulators.

6. An apparatus according to claim 4 wherein at least one of the pair of Josephson junctions is a three terminal superconducting element.

7. An apparatus according to claim 4, wherein said harmonic separating means is operatively connected to the balanced modulator to receive said output current therefrom.

* * * * *